United States Patent
Im

(10) Patent No.: US 7,948,303 B2
(45) Date of Patent: May 24, 2011

(54) INTERNAL VOLTAGE GENERATING CIRCUIT

(75) Inventor: Jae-Hyuk Im, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/495,242

(22) Filed: Jun. 30, 2009

(65) Prior Publication Data

US 2010/0308901 A1    Dec. 9, 2010

(30) Foreign Application Priority Data

Jun. 5, 2009    (KR) .................. 10-2009-0049880

(51) Int. Cl.
*G05F 1/10*    (2006.01)
(52) U.S. Cl. ........................................ 327/537; 327/541
(58) Field of Classification Search .................. None
See application file for complete search history.

(56) References Cited

U.S. PATENT DOCUMENTS

| 5,982,222 | A | * | 11/1999 | Kyung | ........................... 327/536 |
| 6,154,411 | A | * | 11/2000 | Morishita | ..................... 365/226 |
| 6,642,866 | B2 | * | 11/2003 | Kuo et al. | ..................... 341/118 |
| 2009/0219080 | A1 | * | 9/2009 | Park | ............................. 327/536 |

FOREIGN PATENT DOCUMENTS

KR    1020050079179    8/2005

OTHER PUBLICATIONS

Notice of Preliminary Rejection issued from Korean Intellectual Property Office on Feb. 7, 2011.

* cited by examiner

*Primary Examiner* — Lincoln Donovan
*Assistant Examiner* — Sibin Chen
(74) *Attorney, Agent, or Firm* — IP & T Group LLP

(57) ABSTRACT

An internal voltage generating circuit is capable of controlling an amount of charge pumping according to an external power supply voltage. The internal voltage generating circuit includes a periodic signal generating unit configured to control generation of periodic signals according to a level of an external power supply voltage, and a pumping unit driven according to the periodic signals generated by the periodic signal generating unit.

19 Claims, 7 Drawing Sheets

INTERNAL VOLTAGE GENERATING CIRCUIT

CROSS-REFERENCE TO RELATED APPLICATIONS

The present application claims priority of Korean patent application number 10-2009-0049880, filed on Jun. 5, 2009, the disclosure of which is incorporated by reference in its entirety.

BACKGROUND OF THE INVENTION

The present invention relates to an internal voltage generating circuit which is capable of producing a stable voltage by reducing a voltage level variation width.

Semiconductor memory devices often use internal voltages generated therein for internal operation, as well as external voltages received from the outside thereof. As an example of internal voltage generating circuits generating the internal voltages, an internal voltage generating circuit configured to generate a voltage (VPP voltage) higher than an external high voltage or a voltage (VBB voltage) lower than an external low voltage (ground voltage) generates a desired voltage by using a charge pump scheme.

FIG. 1 is a block diagram of an internal voltage generating circuit using a conventional charge pump scheme.

Referring to FIG. 1, the internal voltage generating circuit of a conventional semiconductor memory device includes a level detector 10, a ring oscillator 12, a pump control logic 14, and a charge pump 16. The level detector 10 compares a reference voltage VREF with a high voltage VPP provided as a feedback voltage to detect a voltage level at which the high voltage can maintain a constant voltage level. The ring oscillator 12 generates a clock signal OSC for generation of the high voltage VPP, based on an output signal PPE of the level detector 10. The pump control logic 14 controls the generation of the high voltage VPP in response to the clock signal OSC of the ring oscillator 12. The charge pump 16 generates the high voltage VPP under the control of the pump control logic 14.

In the conventional internal voltage generating circuit, when the fed-back high voltage is lower than the reference voltage, the level detector 10 outputs a voltage level detection signal PPE. The voltage level detection signal PPE drives the ring oscillator 12. At the pump control logic 14, the clock signal OSC generated from the ring oscillator 12 is converted into a signal for control of the charge pump 16. When the high voltage VPP provided as a feedback voltage is lower than the reference voltage VREF, the charge pump 16 receives the output signal of the pump control logic 14 and boosts an external power supply voltage VDD to generate the high voltage VPP.

However, the conventional internal voltage generating circuit has the following problems.

FIG. 2 illustrates a variation of a voltage level that is pumped according to a variation of an external power supply voltage VDD in the conventional charge pump scheme.

As the external power supply voltage VDD increases from a voltage VA to a voltage VC, the amount of charges generated per each cycle of the charge pump increases. However, even if the external power supply voltage VDD increases, a certain amount of time is necessary for the level detector 10 to respond. Therefore, when the external power supply voltage VDD has a comparatively high level, an excessive over-pumping section may occur.

FIG. 3 illustrates the actual level of the VPP that is generated to be higher than its target level in the conventional charge pump scheme. The internal voltage generating circuit using the conventional charge pump scheme increases the amount of charges generated by the charge pump as the external power supply voltage VDD increases. Also, a certain amount of time is taken for the VPP level detector to respond, which causes the over-pumped voltage generation.

SUMMARY OF THE INVENTION

Embodiments of the present invention are directed to providing an internal voltage generating circuit which is capable of controlling an amount of charge pumping according to an external power supply voltage.

In accordance with an aspect of the present invention, there is provided an internal voltage generating circuit, which includes a periodic signal generating unit configured to generate periodic signals according to a level of an external power supply voltage, and a pumping unit driven according to the periodic signals.

In accordance with another aspect of the present invention, there is provided an internal voltage generating circuit, which includes a level detecting unit configured to detect an internal voltage to generate a pump operation control signal, a ring oscillator configured to generate a clock signal by using the pump operation control signal, an oscillation adjusting unit configured to receive the clock signal to generate a plurality of periodic signals, and control whether to generate the periodic signals according to a level of an external power supply voltage, a pump control logic configured to generate pump driving signals by using the periodic signals, and a charge pumping unit driven by the pump driving signals.

DESCRIPTION OF SPECIFIC EMBODIMENTS

Figure 1:
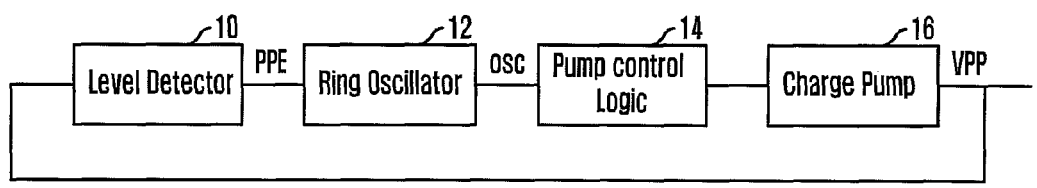
FIG. 1 is a block diagram of a conventional internal voltage generating circuit.
Figure 2:
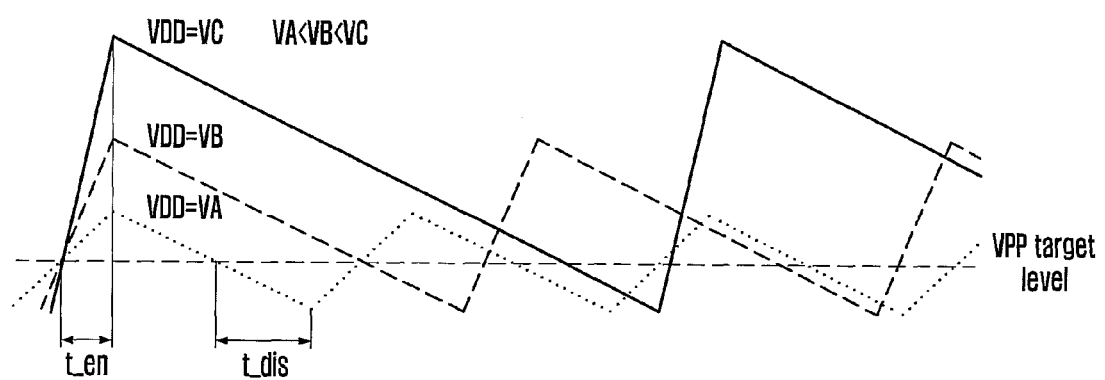
FIG. 2 is a graph showing a voltage level variation when a conventional charge pump scheme is used.
Figure 3:
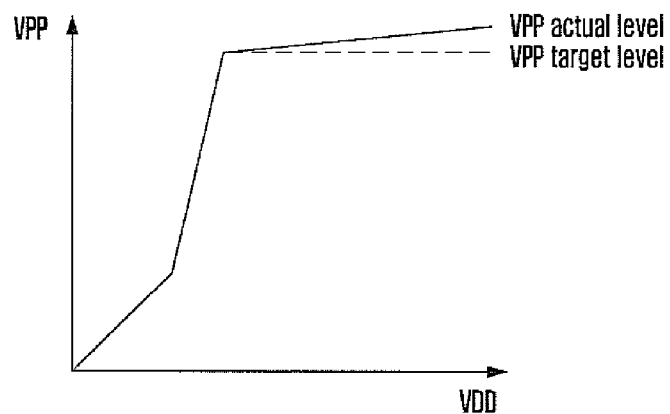
FIG. 3 is a graph showing an actual VPP level compared to a target VPP level when a conventional charge pump scheme is used.

Other objects and advantages of the present invention can be understood by the following description, and become apparent with reference to the embodiments of the present invention. The present invention may, however, be embodied in different forms and should not be construed as limited to the embodiments set forth herein. In the drawings, the dimensions of layers and regions are exaggerated for clarity of illustration. Like reference numerals refer to like elements throughout.

Figure 4:
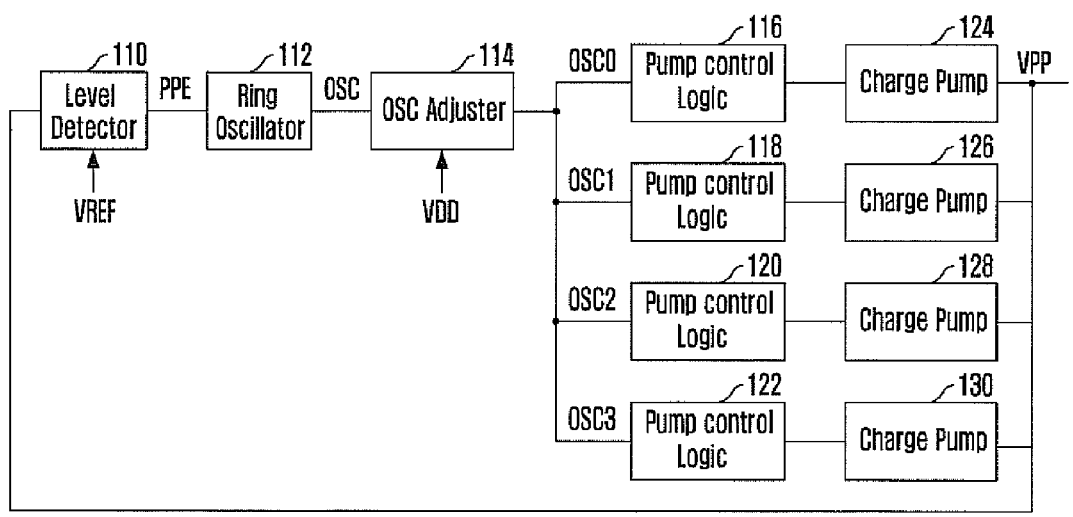
FIG. 4 is a block diagram of an internal voltage generating circuit in accordance with an embodiment of the present invention.

FIG. 4 is a block diagram of an internal voltage generating circuit in accordance with an embodiment of the present invention.

Referring to FIG. 4, the internal voltage generating circuit includes a level detector 110, a ring oscillator 112, an oscillation (OSC) adjuster 114, a plurality of pump control logics 116 to 122, and a plurality of charge pumps 124 to 130. The level detector 110 compares a reference voltage VREF with a high voltage VPP provided as a feedback voltage to detect a voltage level at which the high voltage VPP can maintain a constant voltage level. The ring oscillator 112 generates a clock signal OSC for generation of the high voltage VPP, based on an output signal PPE of the level detector 110. The OSC adjuster 114 converts the clock signal OSC generated by the ring oscillator 112 into a plurality of periodic signals according to an external power supply voltage VDD. The pump control logics 116 to 122 generate pump control signals for controlling the generation of the high voltage VPP by using the periodic signal of the OSC adjuster 114. The charge pumps 124 to 130 generate the high voltage VPP under the control of the pump control logics 116 to 122.

Figure 5:
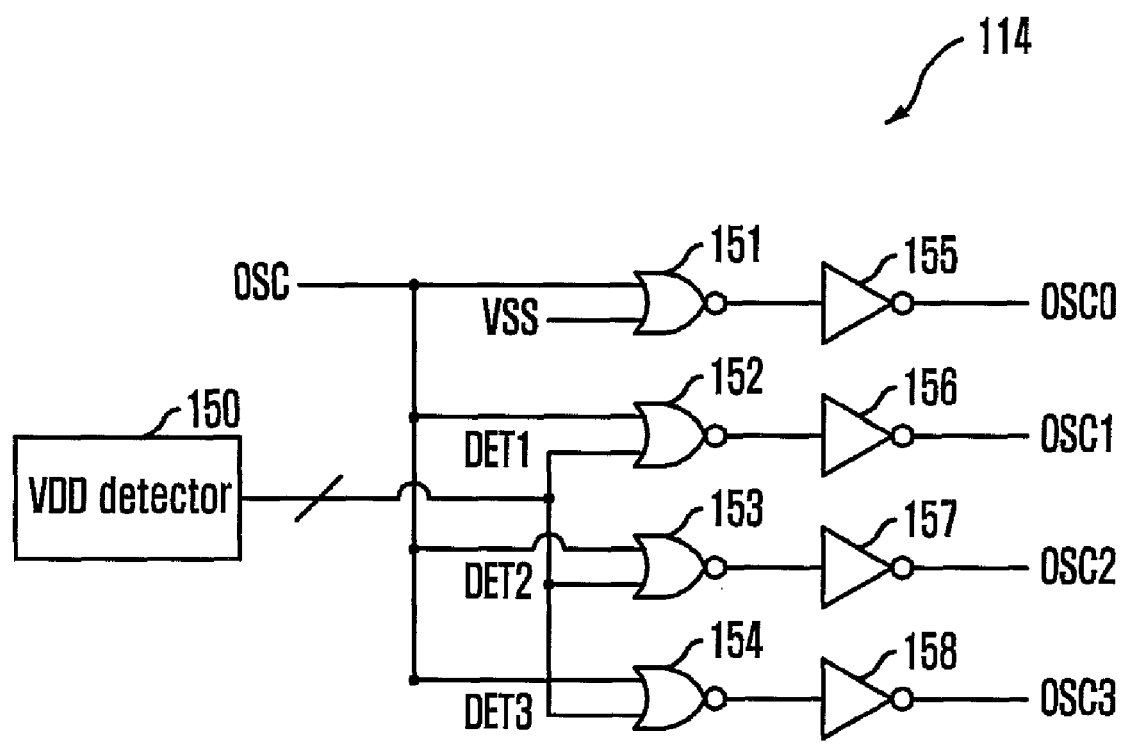
FIG. 5 is a circuit diagram of an OSC adjuster of FIG. 4.

FIG. 5 is a circuit diagram of the OSC adjuster 114 in accordance with an embodiment of the present invention. Referring to FIG. 5, the OSC adjuster 114 includes a VDD detector 150 configured to detect a level of the external power supply voltage VDD. The OSC adjuster 114 combines the clock signal OSC generated by the ring oscillator 112 and detection signals of the VDD detector 150 to generate periodic signals OSC0 to OSC3 having different periods. In this embodiment of the present invention, the periodic signals are generated through the combination of NOR gates 151 to 153 and inverters 155 to 158.

Herein, the OSC adjuster 114 repeats the inputted clock signal OSC by using the detection signal of the VDD detector 150. That is, the periodic signal OSC0 is generated through the NOR gate 151 receiving the ground voltage VSS by simply repeating the inputted clock signal OSC. In case of the NOR gates 152 to 154 receiving the detection signals DET1 to DET3 of the VDD detector 150, the periodic signals OSC1 to OSC3 are generated during the time that the detection signals DET1 to DET3 are at a low level. On the contrary, the generation of the periodic signals OSC1 to OSC3 is suppressed during the time that the detection signals are at a high level.

Figure 6:
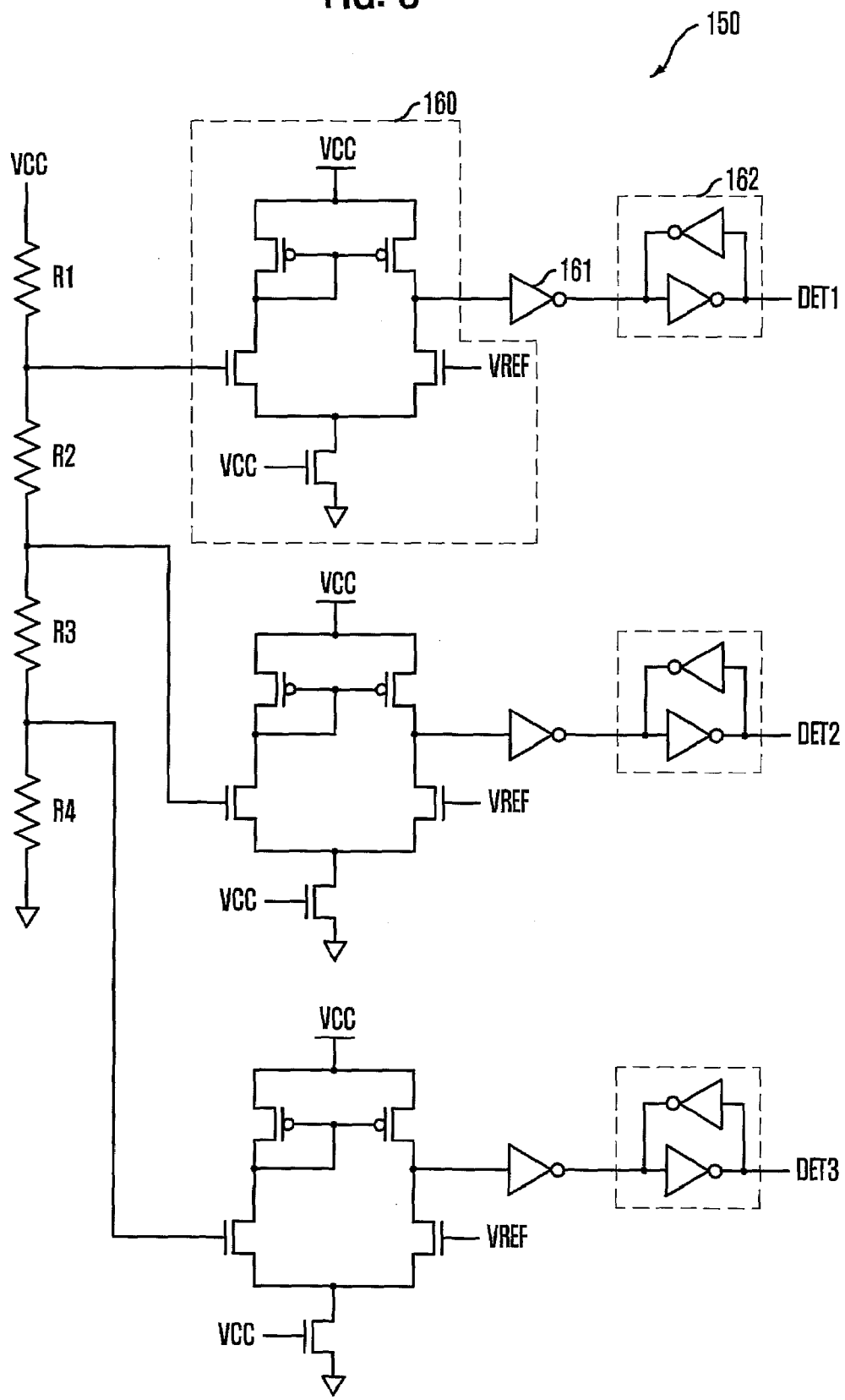
FIG. 6 is a circuit diagram of a VDD detector of FIG. 5.

FIG. 6 is a circuit diagram of the VDD detector 150 in accordance with an embodiment of the present invention. Referring to FIG. 6, the VDD detector 150 divides the external power supply voltage VCC or VDD by resistors R1 to R4 serving as a voltage dividing unit, and the divided voltage is inputted to a comparison amplifier 160. The reference voltage VREF according to the target level is also inputted to the comparison amplifier 160. That is, when the divided voltage is higher than the reference voltage VREF, the comparison amplifier 160 outputs a logic high signal. The number of comparison amplifiers 160 included in the VDD detector 150 is equal to the number of the divided levels of the external power supply voltage VCC or VDD.

Figure 11:
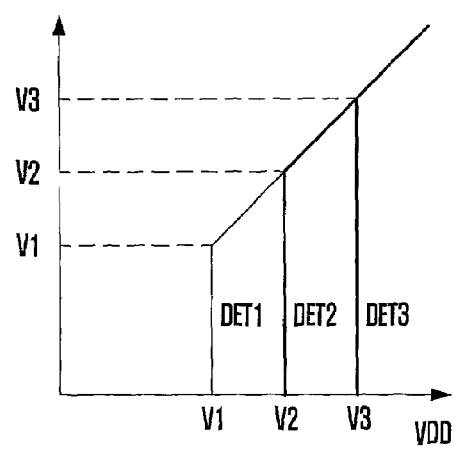
FIG. 11 is an output waveform diagram of the VDD detector according to a VDD variation in accordance with an embodiment of the present invention.

Therefore, as the external power supply voltage VDD increases from 0 V, the detection signal DET1 changes from a logic low level to a logic high level, and then the detection signal DET2 changes from a logic low level to a logic high level. Finally, the detection signal DET3 changes from a logic low level to a logic high level. FIG. 11 illustrates the output of the VDD detector 150 according to the VDD variation. When the external power supply voltage VDD is lower than the reference voltage V1, the detection signals DET1 to DET3 become a logic low state. When the external power supply voltage VDD increases to be higher than the voltage V1, the first detection signal DET1 becomes the VDD level. When the external power supply voltage VDD increases to be higher than the voltage V2, the second detection signal DET2 becomes the VDD level. When the external power supply voltage VDD increases to be higher than the voltage V3, the third detection signal DET3 becomes the VDD level together with the first and second detection signal DET1 and DET2.

Figure 12:
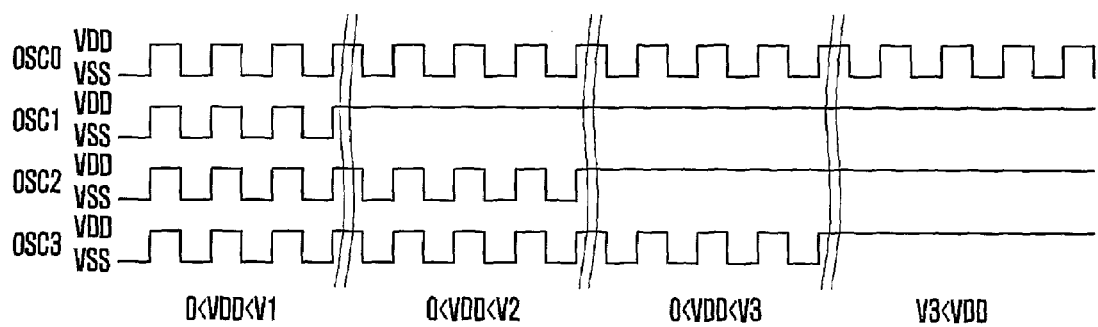
FIG. 12 is an output waveform diagram of the OSC adjuster in accordance with an embodiment of the present invention.

FIG. 12 is a waveform diagram of the output signals of the OSC adjuster 114 according to the VDD level detection of the VDD detector 150. That is, during the time that the VDD level is higher than 0 V and lower than V1 level, the periodic signals OSC0 to OSC3 toggle at a constant period. During the time that the VDD level is higher than V1 level and lower than V2 level, the periodic signal OSC1 is fixed to a high level state, and the other periodic signals OSC0, OSC2 and OSC3 toggle at a constant period. During the time that the VDD level is higher than V2 level and lower than V3 level, the periodic signals OSC1 and OSC2 are fixed to a high level state, and the other periodic signals OSC0 and OSC3 toggle at a constant period. During the time that the VDD level is higher than V3 level, the periodic signals OSC1 to OSC3 are fixed to a high level state, and the periodic signal OSC0 toggles at a constant period.

Figure 7:
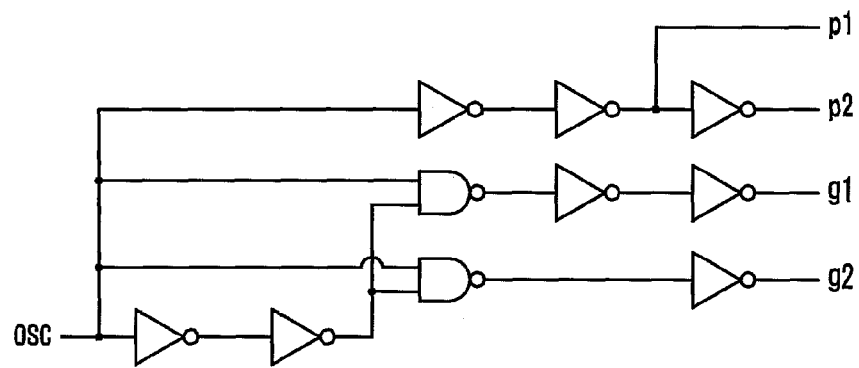
FIG. 7 is a circuit diagram of a pump control logic of FIG. 4.

FIG. 7 is a circuit diagram of the pump control logic (116-122) in accordance with an embodiment of the present invention.

The plurality of pump control logics 116 to 122 are provided to receive the periodic signals OSC0 to OSC3 generated by the OSC adjuster 114, respectively. Since they have the same configuration each other, one pump control logic 116 is illustrated in FIG. 7.

The pump control logic is configured to generate a desired logic signal from the periodic signal by using several logic devices. In this embodiment, four pump control signals p1, p2, g1, and g2 are generated from the pump control logic by using inverters and NAND gates. The pump control logic generates signals that are higher than the power supply voltage or lower than the ground voltage by using the periodic signal.

Figure 8:
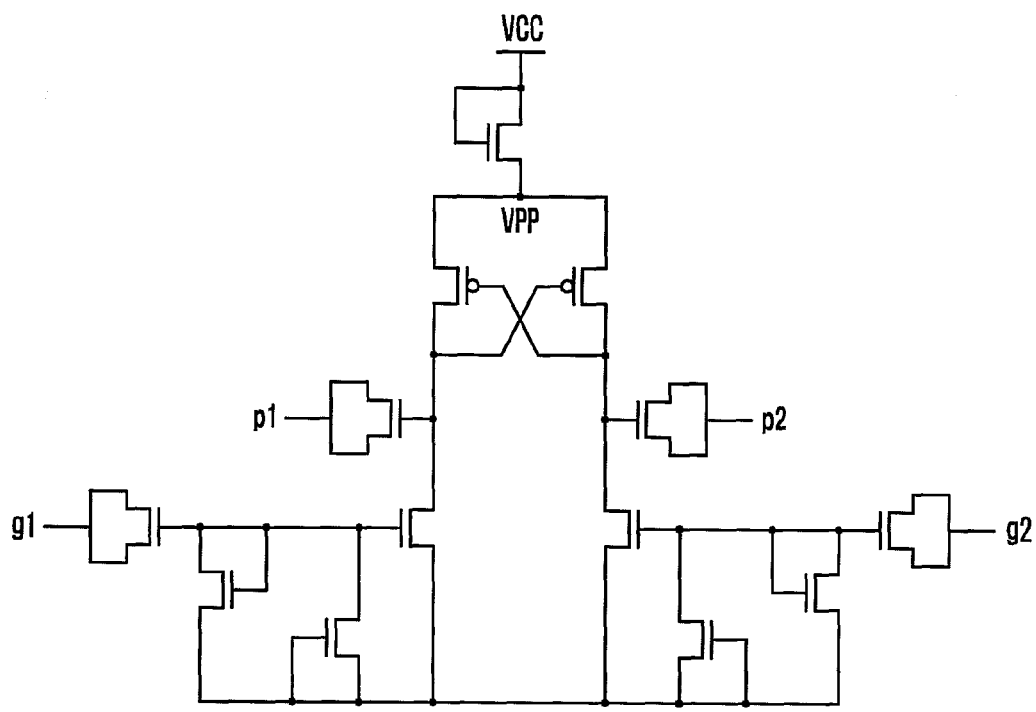
FIG. 8 is a circuit diagram of a charge pump of FIG. 4.

FIG. 8 is a circuit diagram of the charge pump in accordance with an embodiment of the present invention.

The charge pumps 124 to 130 pump the external power supply voltage VCC to generate the high voltage VPP by using the output signals of the pump control logics.

That is, the plurality of pump control logics receiving the periodic signals OSC0 to OSC3 generated by the OSC adjuster 114 are provided, and the entire charge pumps 124-130 are divided into different parts so that the output signals of the pump control logics separately control the entire charge pumps. The number of the charge pumps that are driven can be reduced in response to the VDD increase. Thus, it is possible to sequentially reduce an over-pumping noise due to the VDD increase.

Figure 9:
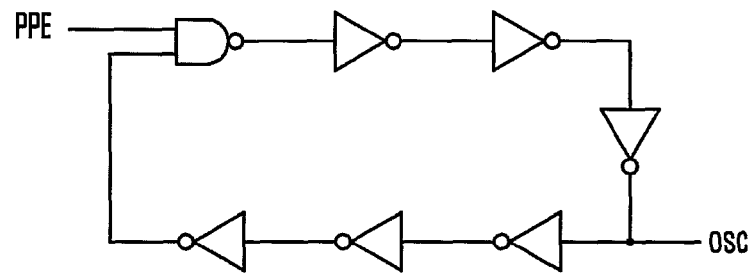
FIG. 9 is a circuit diagram of a ring oscillator of FIG. 4.
Figure 10:
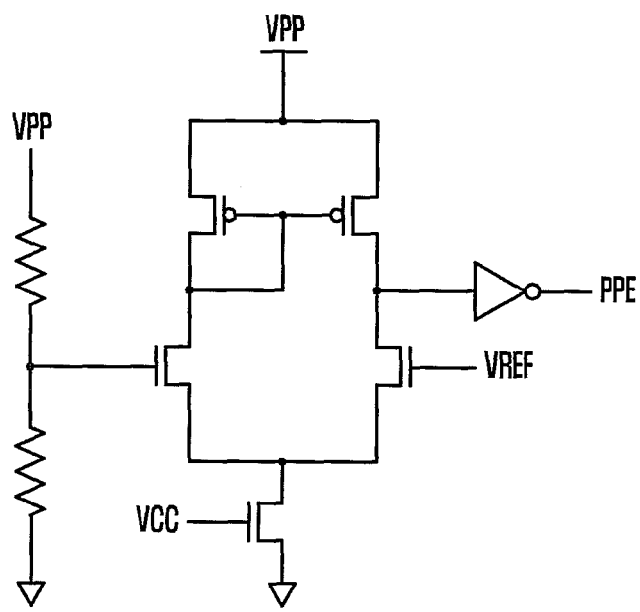
FIG. 10 is a circuit diagram of a level detector of FIG. 4.

FIGS. 9 and 10 are circuit diagrams of the ring oscillator 112 and the level detector 110 in accordance with an embodiment of the present invention. The level detector 110 compares the reference voltage VREF with the high voltage VPP provided as a feedback voltage to detect the voltage level at which the high voltage can maintain a constant voltage level. The ring oscillator 112 generates the clock signal OSC for generation of the high voltage VPP, based on the output signal PPE of the level detector 110.

In accordance with the embodiments of the present invention, the number of the charge pumps driven can be reduced as the level of the external power supply voltage increases, thereby reducing unwanted over-pumping noise. Furthermore, in spite of the level variation of the external power supply voltage, the internal voltage VPP can be adjusted constantly, thereby obtaining a stable operation of the semiconductor memory device.

While the present invention has been described with respect to the specific embodiments, it will be apparent to those skilled in the art that various changes and modifications may be made without departing from the spirit and scope of the invention as defined in the following claims.

What is claimed is:

1. An internal voltage generating circuit, comprising:
   a level detecting unit configured to detect an output voltage generated by a pumping operation, based on a reference voltage, to generate a pump operation control signal;
   a periodic signal generating unit configured to generate periodic signals based on the pump operation control signal, and control whether to activate the periodic signals according to a level of an external power supply voltage, wherein the periodic signal generating unit comprises a detecting unit configured to detect the level of the external power supply voltage based on the reference voltage; and
   a pumping unit configured to perform the pumping operation according to the periodic signals.

2. The internal voltage generating circuit of claim 1, wherein the periodic signal generating unit further includes a ring oscillator configured to generate a clock signal toggling at a predetermined periodic cycle based on the pump operation control signal.

3. The internal voltage generating circuit of claim 2, wherein the periodic signal generating unit further includes an operation unit configured to combine the clock signal and at least one output signal of the detecting unit.

4. The internal voltage generating circuit of claim 1, wherein the detecting unit divides the external power supply voltage to output divided voltages and compares the divided voltages with the reference voltage to generate a plurality of detection signals.

5. The internal voltage generating circuit of claim 1, wherein the pumping unit includes a plurality of charge pumps which are selectively driven according to the periodic signals.

6. The internal voltage generating circuit of claim 5, wherein the pumping unit further includes a pump control logic configured to generate driving signals of the charge pumps by using the periodic signals.

7. The internal voltage generating circuit of claim 6, wherein the driving signals used by the charge pumps are higher than a power supply voltage or lower than a ground voltage.

8. The internal voltage generating circuit of claim 1, wherein the periodic signal generating unit further includes a ring oscillator to generate an oscillation signal based on the pump operation control signal and an operation unit for generating the periodic signals based on the oscillation signal and a detected result of the detecting unit,
   wherein the periodic signals are provided to different charge pumps of the pumping unit, respectively, and a number of the periodic signals that are enabled to be output to the charge pumps is varied dependent on a voltage of the external supply voltage.

9. The internal voltage generating circuit of claim 1, wherein the periodic signal generating unit includes:
   a ring oscillator configured to generate a clock signal toggling at a predetermined periodic cycle based on the pump operation control signal; and
   an oscillation adjuster configured to receive the clock signal to generate a plurality of output signals,
   wherein the generation of the plurality of output signals is controlled according to the level of the external power supply voltage.

10. The internal voltage generating circuit of claim 9, wherein the oscillation adjuster includes:
    the detecting unit configured to detect the level of the external power supply voltage; and
    an operation unit configured to combine the clock signal and a detection signal of the detecting unit.

11. An internal voltage generating circuit, comprising:
    a level detecting unit configured to detect an internal voltage based on a reference voltage to generate a pump operation control signal;
    a ring oscillator configured to generate a clock signal by using the pump operation control signal;
    an oscillation adjusting unit configured to receive the clock signal to generate a plurality of periodic signals, detect the level of an external power supply voltage based on the reference voltage, and control whether to activate the periodic signals according to the detected result;
    a pump control logic configured to generate pump driving signals by using the periodic signals; and
    a charge pumping unit driven by the pump driving signals.

12. The internal voltage generating circuit of claim 11, wherein the oscillation adjusting unit includes:
    a detecting unit configured to detect the level of the external power supply voltage to output the detected result as a detection signal; and
    an operation unit configured to combine the clock signal and the detection signal.

13. The internal voltage generating circuit of claim 12, wherein the detecting unit divides the external power supply voltage to output divided voltages and compares the divided voltages with the reference voltage to generate the detection signal.

14. The internal voltage generating circuit of claim 13, wherein the detecting unit includes a differential amplifier.

15. The internal voltage generating circuit of claim 14, wherein the detecting unit further includes a latch unit configured to latch an output signal of the differential amplifier.

16. The internal voltage generating circuit of claim 15, wherein the oscillation adjusting unit outputs the clock signal as one of the periodic signals regardless of the detection signal of the detecting unit.

17. The internal voltage generating circuit of claim 16, wherein the charge pumping unit includes a plurality of charge pumps, and the charge pumps are selectively driven according to the level of the external power supply voltage.

18. The internal voltage generating circuit of claim 17, wherein the number of the charge pumps driven decreases as the level of the external power supply voltage increases.

19. The internal voltage generating circuit of claim 18, wherein the pump control logic includes a plurality of logics to generate the pump driving signals.

* * * * *